US012595188B2

(12) United States Patent
Aga et al.

(10) Patent No.: US 12,595,188 B2
(45) Date of Patent: Apr. 7, 2026

(54) FERRITE POWDER, FERRITE RESIN COMPOSITE MATERIAL, AND ELECTROMAGNETIC SHIELDING MATERIAL, ELECTRONIC MATERIAL, OR ELECTRONIC COMPONENT

(71) Applicant: POWDERTECH CO., LTD., Chiba (JP)

(72) Inventors: Koji Aga, Chiba (JP); Takashi Kojima, Chiba (JP); Takao Sugiura, Chiba (JP); Tadashi Tsuduki, Chiba (JP); Satomi Konno, Chiba (JP); Sho Kuwahara, Chiba (JP)

(73) Assignee: POWDERTECH CO., LTD., Chiba (JP)

( * ) Notice: Subject to any disclaimer, the term of this patent is extended or adjusted under 35 U.S.C. 154(b) by 636 days.

(21) Appl. No.: 17/641,009

(22) PCT Filed: Oct. 7, 2020

(86) PCT No.: PCT/JP2020/038020
§ 371 (c)(1),
(2) Date: Mar. 7, 2022

(87) PCT Pub. No.: WO2021/070871
PCT Pub. Date: Apr. 15, 2021

(65) Prior Publication Data
US 2022/0340444 A1      Oct. 27, 2022

(30) Foreign Application Priority Data
Oct. 7, 2019      (JP) ................................. 2019-184770

(51) Int. Cl.
*C01G 49/06* (2006.01)
*C01G 49/00* (2006.01)
(Continued)

(52) U.S. Cl.
CPC ......... *C01G 49/06* (2013.01); *C01G 49/0072* (2013.01); *C08L 63/00* (2013.01);
(Continued)

(58) Field of Classification Search
None
See application file for complete search history.

(56) References Cited

U.S. PATENT DOCUMENTS 6,793,842 B2 *  9/2004  Akimoto ................... H01F 1/36
                                                                423/594.2
2013/0011781 A1    1/2013  Kawauchi et al.
(Continued)

FOREIGN PATENT DOCUMENTS

JP          H04154869 A       5/1992
JP          H04304700 A      10/1992
(Continued)

OTHER PUBLICATIONS

International Search Report for International Application No. PCT/JP2020/038020; Date of Mailing, Dec. 15, 2020.
(Continued)

*Primary Examiner* — Sheng H Davis
(74) *Attorney, Agent, or Firm* — CANTOR COLBURN LLP

(57)          ABSTRACT

Provided are: a ferrite powder whereby, when the ferrite powder is applied in a composite material, dropping out of ferrite particles is suppressed without moldability and filling ability being compromised; a ferrite resin composite material; and an electromagnetic shielding material, an electronic material, or an electronic component. This ferrite powder includes at least spherical or polyhedral ferrite particles in which a step structure is provided on surfaces thereof, the step structure having a polyhedral outline in the surfaces of the ferrite particles.

7 Claims, 2 Drawing Sheets

(51) Int. Cl.

*C08L 63/00*         (2006.01)

*H05K 9/00*         (2006.01)

(52) U.S. Cl.

CPC ........ *H05K 9/0075* (2013.01); *C01P 2004/03* (2013.01); *C01P 2004/32* (2013.01); *C01P 2004/61* (2013.01); *C01P 2004/62* (2013.01); *C01P 2006/12* (2013.01); *C01P 2006/42* (2013.01)

(56)           References Cited

U.S. PATENT DOCUMENTS

| | | | |
|---|---|---|---|
| 2015/0277256 A1* | 10/2015 | Sawamoto | H01F 1/01 428/402 |
| 2016/0266510 A1* | 9/2016 | Sasaki | H01F 1/36 |
| 2018/0179082 A1 | 6/2018 | Aga et al. | |
| 2019/0300379 A1 | 10/2019 | Kojima et al. | |
| 2019/0341177 A1 | 11/2019 | Kojima et al. | |
| 2021/0047200 A1 | 2/2021 | Aga et al. | |

FOREIGN PATENT DOCUMENTS

| | | | |
|---|---|---|---|
| JP | H07230182 | * | 8/1995 |
| JP | 2006160560 A | | 6/2006 |
| JP | 2011170272 | * | 9/2011 |
| JP | 2011170272 A | | 9/2011 |
| JP | 2016060682 A | | 4/2016 |
| JP | 5921801 B2 | | 5/2016 |
| JP | 2017072771 | | 4/2017 |
| JP | 2018120921 | * | 8/2018 |
| KR | 20120132539 A | | 12/2012 |
| TW | 201935491 A | | 9/2019 |
| WO | 2017212997 A1 | | 12/2017 |
| WO | 2018061327 A1 | | 4/2018 |
| WO | 2019159797 A1 | | 8/2019 |
| WO | 2019159799 A1 | | 8/2019 |

OTHER PUBLICATIONS

KR Office Action for corresponding KR Application No. 10-2022-7007095; issued Jul. 10, 2025.

\* cited by examiner

FERRITE POWDER, FERRITE RESIN COMPOSITE MATERIAL, AND ELECTROMAGNETIC SHIELDING MATERIAL, ELECTRONIC MATERIAL, OR ELECTRONIC COMPONENT

CROSS REFERENCE TO RELATED APPLICATIONS

This is the U.S. national stage of application No. PCT/JP2020/038020, filed on Oct. 7, 2020. Priority under 35 U.S.C. § 119 (a) and 35 U.S.C. § 365 (b) is claimed from Japanese Application No. 2019-184770, filed Oct. 7, 2019, the disclosure of which is also incorporated herein by reference.

TECHNICAL FIELD

The present invention relates to a ferrite powder, a ferrite resin composite material, and an electromagnetic shielding material, an electronic material or an electronic component.

BACKGROUND ART

Composite materials composed of ferrite powder and resins have been widely used in various applications, including electromagnetic shielding materials. Such composite materials are produced by kneading of ferrite powder with resins. The composite materials are shaped into various composite articles (shaped articles) with different shapes such as sheets. In the formation of the composite articles, the particles, which constitute the ferrite powder, close to a spherical shape result in higher flowability in a shaping process and higher filling rate of the ferrite powder in the composite articles. Accordingly, such particles contribute to good formability and improved characteristics such as electromagnetic shielding properties. From this point of view, ferrite powder (particles) composed of spherical or polyhedral particles has been proposed.

For example, Patent Document 1 (PCT International Publication No. WO2017/212997) discloses substantially Zn-free monocrystalline ferrite particles having a mean particle size of 1 to 2000 nm with a perfectly spherical shape and containing 3 to 25 wt % Mn and 43 to 65 wt % Fe. This patent also discloses that the shaped article composed of such ferrite particles and binder resins exhibits the maximum value of the real part of the complex magnetic permeability in a frequency band of 100 MHz to 1 GHz, and the use of such ferrite particles in the electromagnetic shielding material for electronic devices can lead to effective electromagnetic shielding properties in a broad frequency band regardless of frequency. (Claim 1 and [0078] in Patent Document 1).

Patent Document 2 (Japanese Unexamined Patent Application, Publication No. 2016-60682) discloses a perfectly spherical ferrite powder including 15 to 30 wt % ferrite particles with a particle size of less than 11 μm and having a volume average particle size of 10 to 50 μm. This patent also discloses that such a spherical ferrite powder exhibits high filling ability, high formability, superior handling ability, and high electric resistance in the use as filler materials, and that these advantages allow the shaped articles made from the resin composition composed of such spherical ferrite powder and resins to be used in various applications including IC sealants for electromagnetic wave absorption (claim 1 and [0093] in Patent Document 2).

Patent Document 3 (International Publication No. 2018/061327) discloses Ni—Zn—Cu-based monocrystalline ferrite particles having a mean particle size of 1 to 2000 nm with a polyhedral shape and containing 5 to 10 wt % Ni, 15 to 30 wt % Zn, 1 to 5 wt % Cu, and 25 to 50 wt % Fe. This patent also discloses that such ferrite particles have both high saturation magnetization and high electric resistance, and are suitable for magnetic fillers or raw materials used in shaped articles (claim 1 and [0089] in Patent Document 3).

Patent Document 4 (Japanese Unexamined Patent Application, Publication No. 2006-160560) discloses spherical sintered ferrite particles having (a) a soluble ion content of 5 ppm or less, (b) a mean particle size of 10 to 50 μm and (c) a spinel structure identified through crystalline structural analysis by X-ray diffraction. This patent also discloses that a resin composition for a semiconductor sealant containing fillers composed of such spherical sintered ferrite particles and silica particles has low viscosity and high flowability and further exhibits high electromagnetic shielding properties, and that a semiconductor device including a sealing material containing such a resin composition has superior electromagnetic compatibility (EMC) (claim 1 and [0023] in Patent Document 4).

Patent Document 5 (Japanese Unexamined Patent Application, Publication No. H04-304700) discloses a powder material for electromagnetic wave absorption composed of spherical Mn—Zn-based ferrite particles having a mean particle size of 50 to 150 μm. This patent also discloses that a mean particle size of 150 μm or less causes enhanced flowability, resulting in a reduction in clogging of the gate during injection molding, which has been an obstacle to an increase in the particle size of the material (claim 1 and [0008] in Patent Document 5).

In the use in different applications from composite materials such as electromagnetic shielding material, Patent Document 6 (Japanese Patent No. 5921801) discloses a method for producing a carrier core material for an electrophotographic developer, the carrier core material having stepped irregularities which are an aggregation of raised portions concentrically spread on the surface of the particles and having a sphericity of 0.8 or more. This patent also discloses that the carrier core material is produced by granulating a mixture of $Fe_2O_3$ powder as raw material, carbonate as auxiliary raw material in a content of 10 to 50 g for 10 kg $Fe_2O_3$ powder, and a reducing agent, and then firing the mixture at a temperature of 1000° C. or lower (claim 1 and [0024] in Patent Document 6).

Patent Document 1: PCT International Publication No. WO2017/212997
Patent Document 2: Japanese Unexamined Patent Application, Publication No. 2016-60682
Patent Document 3: PCT International Publication No. WO2018/061327
Patent Document 4: Japanese Unexamined Patent Application, Publication No. 2006-160560
Patent Document 5: Japanese Unexamined Patent Application, Publication No. H04-304700
Patent Document 6: Japanese Patent No. 5921801

DISCLOSURE OF THE INVENTION

Problems to be Solved by the Invention

As described above, it has been proposed to improve the formability and the filling ability in composite materials or composite articles with spherical or polyhedral ferrite powder. Unfortunately, the study by the present inventors reveals that the production of composite articles with such ferrite powder and resin results in the issue of detachment of the ferrite particles from the composite articles. In particular, a large number of ferrite particles were found to be detached during processing the composite articles (generation of a large number of detached particles). Such detachment of ferrite particles is not preferred because it causes a decrease in smoothness on the surface of the composite articles.

In the study of the causes for the detachment of particles, the present inventors have speculated that spherical or polyhedral ferrite particles have poor adhesion to resins because their surfaces are too smooth. Further studies by the present inventors have revealed that, even in use of spherical or polyhedral ferrite particles, the adhesion to the resins can be improved by providing a polygonal stepped feature on the surface, and the use of ferrite powder including such particles can lead to prevention of ferrite particles from detaching without impairing formability and filling ability, and have completed the present invention.

Accordingly, it is an object of the present invention to provide ferrite powder, a ferrite resin composite material, and an electromagnetic shielding material, an electronic material or an electronic component, which can prevent the ferrite particles from detaching without impairing formability and filling ability when applied to composite materials or composite articles.

Means for Solving the Problems

The present invention encompasses the following Aspects (1) to (7). In the present specification, "to" in the numerical expression includes the numerical values at both ends thereof. Namely, "X to Y" is synonymous with "X or more to Y or less".

Aspect (1): A ferrite powder comprising spherical or polyhedral ferrite particles having a stepped feature on the surfaces thereof, wherein the stepped feature has polygonal contours on the surfaces of ferrite particles.

Aspect (2): The ferrite powder according to Aspect (1), wherein the stepped feature has two or more steps.

Aspect (3): The ferrite powder according to Aspect (1) or (2), wherein the ferrite powder has a shape factor SF-1 of 100 to 110.

Aspect (4): The ferrite powder according to any one of Aspects (1) to (3), wherein the ferrite powder has a 50% diameter (D50) of 0.10 to 20.00 μm in a volume distribution of particle sizes thereof.

Aspect (5): The ferrite powder according to any one of Aspects (1) to (4), wherein the ferrite powder has a composition of manganese (Mn) ferrite containing manganese (Mn) in a content of 4.0 to 17.0% by mass and iron (Fe) in a content of 50.0 to 70.0% by mass.

Aspect (6): A ferrite resin composite material comprising the ferrite powder according to any one of Aspect (1) to (5) and a resin.

Aspect (7): An electromagnetic shielding material, an electronic material, or an electronic component comprising the ferrite resin composite material according to Aspect (6).

Effects of the Invention

The present invention provides a ferrite powder, a ferrite resin composite material, and an electromagnetic shielding material, an electronic material or an electronic component, which can prevent the ferrite particles from detaching without impairing formability and filling ability when applied to composite materials or composite articles.

PREFERRED MODE FOR CARRYING OUT THE INVENTION

Figure 1:
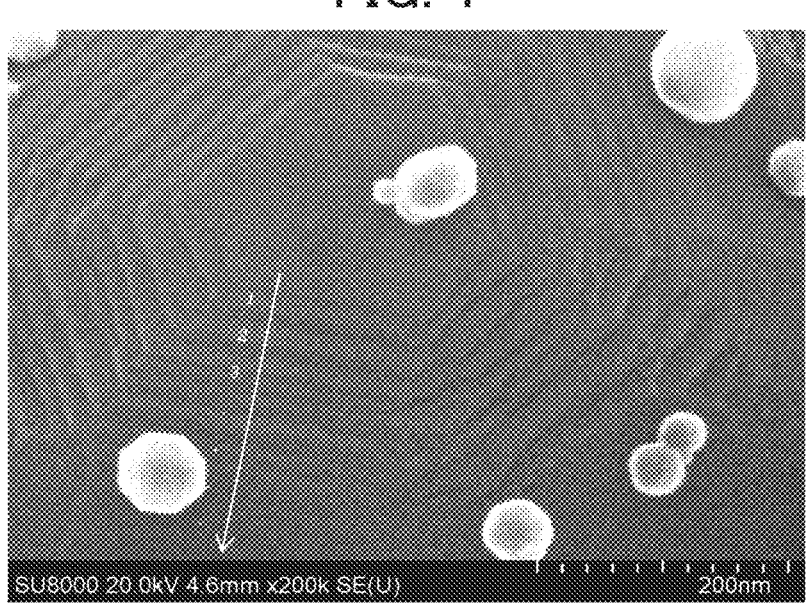
FIG. 1 illustrates a surface SEM image of an example sample.

A specific embodiment of the present invention (hereinafter referred to as "the present embodiment") will now be described. The present invention should not be limited to the following embodiments, and various modifications can be made without changing the gist of the present invention.

1. Ferrite Powder

The ferrite powder according to the present embodiments contains at least spherical or polyhedral ferrite particles having a stepped feature on the surface thereof. This stepped feature has polygonal contours on the surfaces of the ferrite particles.

The ferrite powder according to the present embodiments is composed of a plurality of ferrite particles. Namely, a plurality of ferrite particles collectively constitutes the ferrite powder. Furthermore, the ferrite powder contains at least spherical or polyhedral ferrite particles having a stepped feature on the surface (sphere-like stepped particles). That is, the ferrite particles constituting the ferrite powder may be partially sphere-like stepped particles or wholly sphere-like stepped particles.

The spherical or polyhedral shape of the particles contained in the ferrite powder can lead to an improvement in formability and filling ability of the powder. This improvement is based on the mechanism where spherical or polyhedral particles can smoothly avoid the contact with other particles during forming. Accordingly, the flowability during a forming process is improved and the dense filling can be thus achieved. In contrast, particles having an anisotropic or irregular shape such as a plate or a needle are inferior in formability and filling ability.

Containing of an element having a high saturated vapor pressure such as zinc (Zn) and strontium (Sr) in the ferrite powder tends to make the particles polyhedral. This tendency is believed to be based on the mechanism where the elements having high saturated vapor pressure migrate from the inside to the outside of the particles and function as flux, and thereby the particles readily grow into a polyhedron that reflects the crystal structure during a high-temperature heating process (e.g., spraying process) in the production of ferrite powder. In contrast, the particles tend to be spherical in a ferrite powder, such as manganese (Mn) ferrite, not containing elements having a high saturated vapor pressure.

The polyhedral particles basically have a shape including a three-dimensional combination of a plurality of polygons. The polygons that constitute a polyhedron typically consist of trigons, tetragons, hexagons, octagons, decagons or combinations thereof. Examples of such a polyhedron include a truncated oblique cuboctahedron composed of a combination of tetragons, hexagons and octagons. Also, the polyhedron becomes closer to a sphere as the number of faces increases. Accordingly, the polyhedral particles have preferably a shape of decahedron or more, more preferably dodecahedron or more, and further more preferably tetradecahedron or more. In addition, the polyhedral particles typically have a shape of 100-sided polyhedron or less, more typically 72-sided polyhedron or less, and further more typically 24-sided polyhedron or less.

It should be noted that particles where the ridge lines constituting the polygon are broken at one or more points or the ridge lines are partially curved can also be categorized into polyhedral particles as long as the overall particle is recognized as a polyhedron. In addition, particles where the ridge lines constituting the polygon are finely serrated are also included in the polyhedral particles. Furthermore, the sphere-like stepped particles have a stepped feature on the surface thereof, and strictly speaking, these particles are not always perfectly spherical or polyhedral. However, this stepped feature is much smaller than the dimensions of the particles. Therefore, even when the particles have such a microscopic stepped feature, the particles having the shape of sphere or polyhedron from a macroscopic viewpoint are defined to be spherical or polyhedral particles.

Figure 2:
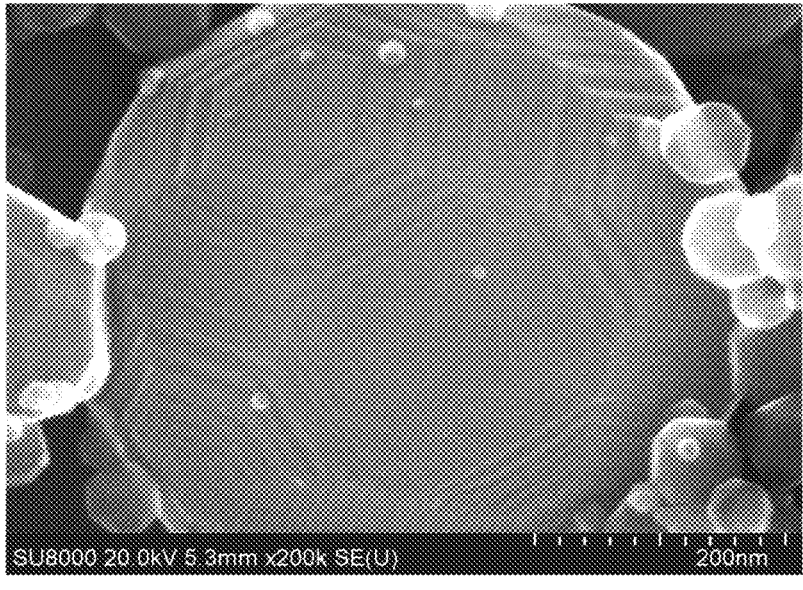
FIG. 2 illustrates a surface SEM image of an example sample.

The ferrite powder according to the present embodiments includes ferrite particles having a stepped feature (spherelike stepped particles). Such stepped feature is described using FIGS. 1 and 2. FIGS. 1 and 2 illustrate surface SEM images of the sphere-like stepped particle in one embodiment among the present embodiments. As can be observed in FIGS. 1 and 2, the particle surface is not smooth and has a stepped feature. Application of the ferrite powder containing the particles having such a stepped feature to composite materials or composite articles can reduce the detachment of particles due to enhanced adhesion of the particles to the resin. Although the detailed mechanism is unknown, a plausible hypothesis is that the presence of the stepped feature on the particle surface increases the surface area of the particle, that is, the contact area with the resin, resulting in a higher chemical bonding force between the particle and the resin. It is also speculated that, when the particles fit together with the resin at step edges in the stepped feature, the step edges can function as an anchor to the resin, resulting in a higher physical bonding force between the particles and the resin.

The stepped feature has polygonal contours on the surfaces of the ferrite particles. Namely, the outer shape (contours) of the stepped feature is polygonal when the particles are viewed toward the surface. In other words, the stepped feature is provided so as to surround one region of the particle surface with a combination of ridge lines. Such a stepped feature can be provided to more effectively prevent detachment of the particles. The contours of the stepped feature may have any polygonal shape. However, the contours are typically trigonal, tetragonal, hexagonal, octagonal, decagonal reflecting the crystal structure of ferrite. In addition, the ferrite particles may have multiple stepped features on the surface thereof. Such multiple stepped features can more effectively prevent detachment of the particles. The number of stepped features included in each ferrite particle is preferably 4 to 50, more preferably 4 to 30.

It is preferred that the contours in the stepped feature have no ends, that is, they are composed of closed lines. However, even when the ridge lines constituting the contours are broken at one or more points, the ridge lines are partially curved, or the ridge lines are finely serrated, such ridge lines can be determined to be contours having polygonal shapes as long as the contours viewed as a whole can be recognized as polygonal shapes.

The steps constituting the stepped feature may be one step or multiple steps. However, the larger number of steps can more effectively contribute to the prevention of detachment of particles. Accordingly, the number of steps is preferably two or more, more preferably four or more. In contrast, if the number of steps is excessively large, the flowability of the ferrite powder may be reduced. The number of steps is thus preferably 100 or less, more preferably 80 or less. When the stepped feature is constructed with multiple steps, the area surrounded by the upper step is one size smaller than the area surrounded by the lower step. In other words, the stepped feature is composed of a laminate of polygonal plates that have smaller areas toward the upper steps.

Figure 3:
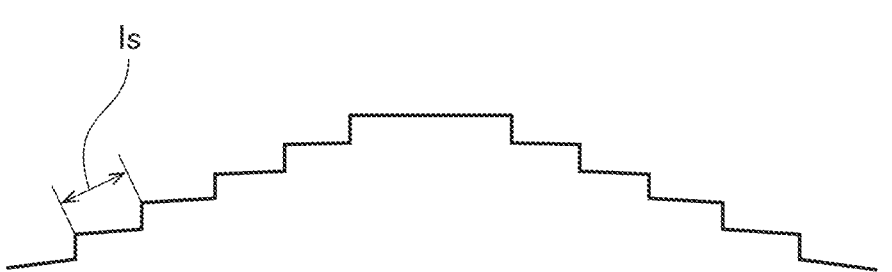
FIG. 3 illustrates a schematic cross-sectional view of a stepped feature.

In the case that the stepped feature includes multiple steps, the mean interval (Hs) of the steps is preferably 0.001 to 0.2 μm (1 to 200 nm). The term "mean interval (Hs)" indicates the mean value of the distances between adjacent steps in the stepped feature. This definition will be described in FIG. 3. FIG. 3 illustrates a schematic cross-sectional view of a multiple-stepped feature. As shown in FIG. 3, the multiple-stepped feature has a plurality of step edges, and adjacent step edges are separated by a certain distance. The mean value of the distances between adjacent step edges is defined as the mean interval (Hs) of the steps. The mean interval (Hs) can be determined by observation of the surfaces of ferrite particles with, for example, a scanning electron microscope (SEM). Hs is more preferably 3 nm or more, further more preferably 10 nm or more. In addition, Hs is more preferably 100 nm or less, further more preferably 50 nm or less, particularly more preferably 25 nm or less.

In the case of a volume average particle size (D50) of 2.00 μm or more, the percentage content of the sphere-like stepped particles in the ferrite powder (Ps) is preferably 3% or more, more preferably 20% or more, further more preferably 60% or more on the basis of the number of particles. A higher Ps leads to higher adhesion to the resin and more effective prevention of detachment of the particles. Accordingly, a higher Ps is more preferred. However, Ps is typically 90% or less, more typically 80% or less, further more typically 70% or less. Ps can be determined by observation of the ferrite powder with, for example, a scanning electron microscope (SEM). Ps can be adjusted under control of the conditions for production of the ferrite powder.

In the case of a volume average particle size (D50) of 0.10 μm to less than 2.00 μm, the percentage content of the sphere-like stepped particles in the ferrite powder (Ps) is preferably 0.5% or more, more preferably 1% or more, further more preferably 2% or more on the basis of the number of particles. A higher Ps leads to higher adhesion to the resin and more effective prevention of detachment of the particles. However, the problematic particles readily detachable from the resin has a particle size of 0.3 μm or more. The particles within a volume average particle size of 0.10 μm to less than 2.00 μm have a relatively smaller particle size and a larger BET specific surface area. It is a sufficient condition that Ps satisfies 0.5% or more. Ps is typically 60% or less, more typically 45% or less, further more typically 30% or less. Ps can be determined by observation of the ferrite powder with, for example, a scanning electron microscope (SEM). Ps can be adjusted under control of the conditions for production of the ferrite powder.

The ferrite powder preferably has a shape factor SF-1 of 100 to 110. The term "SF-1" is an index of sphericity of particles constituting the powder. A shape factor SF-1 of 100 indicates a perfectly spherical shape, and the shape factor SF-1 increases as the discrepancy from the spherical shape increases. A shape factor SF-1 of 110 or less causes the powder to have higher flowability and superior formability and filling ability, regardless of spherical or polyhedral particles. The shape factor SF-1 is more preferably 105 or less, further more preferably 103 or less.

The ferrite powder preferably has a shape factor SF-2 of 100 to 110. The term "SF-2" is an index indicating the degree of unevenness on the surface of the particles constituting the powder. A shape factor SF-2 of 100 indicates a smooth surface having no unevenness, and the shape factor SF-2 increases as the unevenness (depth) increases. The ferrite powder according to the present embodiments has a microscopic stepped feature on the surfaces of the particles, and thus exhibits higher adhesion to the resin without detachment of the particles in composite materials or composite articles. Accordingly, a moderately higher shape factor SF-2 is preferred. The shape factor SF-2 is more preferably 101% or more. In contrast, excessively higher shape factor SF-2 results in inferior flowability of the powder, and may thus reduce the formability and filling ability. The shape factor SF-2 is more preferably 105 or less.

The ferrite powder preferably has a 50% diameter in its volume distribution of particle sizes (volume average particle size; D50) of 0.10 to 20.00 μm. A D50 of 0.10 μm or more can reduce agglomeration of the ferrite powder, resulting in superior formability and filling ability. In contrast, a D50 of 20.00 μm or less can reduce generation of interstices among particles, resulting in superior filling ability. The D50 is more preferably 0.50 μm or more, further more preferably 0.60 μm or more, particularly more preferably 0.80 μm or more, most preferably 1.00 μm or more. The D50 is also more preferably 10.00 μm or less, further more preferably 8.00 μm or less, particularly more preferably 6.00 μm or less, most preferably 4.00 μm or less.

In the ferrite powder, the percentage content of particles having a particle size of 0.3 μm or more in the measurement of particle size distribution described later is preferably 0.1% by number or more, more preferably 5.0% by number or more, further more preferably 10.0% by number or more, most preferably 20.0% by number or more. The number distribution of the particle sizes can be calculated by conversion of the observed data of the volume distribution of particle sizes.

The ferrite powder has a tap density of preferably 0.50 to 3.50 g/cm$^3$, more preferably 1.00 to 3.00 g/cm$^3$. Mixing of particles having a smaller particle size with particles having a larger particle size leads to an increase in tap density, resulting in higher filling ability of the ferrite powder as a whole.

The ferrite powder preferably has a BET specific surface area of 0.35 to 10.00 m$^2$/g. A BET specific surface area of 10.00 m$^2$/g or less can reduce agglomeration of the ferrite powder, resulting in superior formability and filling ability. In contrast, a BET specific surface area of 0.35 m$^2$/g or more can reduce generation of interstices among particles, resulting in superior filling ability. Furthermore, the BET specific surface area within the above range causes higher adhesion to the resin when the ferrite powder is applied to composite materials or composite articles. The BET specific surface area is more preferably 0.50 m$^2$/g or more. The BET specific surface area is also more preferably 7.50 m$^2$/g or less, further more preferably 5.00 m$^2$/g or less, particularly more preferably 2.50 m$^2$/g or less.

The ferrite powder may have any composition. However, the ferrite powder preferably has a composition of manganese (Mn) ferrite. The manganese (Mn) ferrite mainly contains manganese (Mn), iron (Fe) and oxygen (O), and may further contain other elements, such as magnesium (Mg), zinc (Zn) and/or strontium (Sr). The manganese (Mn) ferrite may be free of these other elements, and thus may have a composition containing manganese (Mn), iron (Fe), oxygen (O), and the balance being incidental impurities. The manganese (Mn) content in the ferrite powder is preferably 4.0 to 17.0% by mass, and the iron (Fe) content is preferably 50.0 to 70.0% by mass. Such a composition leads to superior magnetic properties of the ferrite powder and the composite materials or the composite articles made from such powder. The manganese (Mn) content is more preferably 4.0 to 11.0% by mass, further more preferably 5.0 to 10.0% by mass. The iron (Fe) content is more preferably 60.0 to 65.0% by mass, further more preferably 61.0 to 65.0% by mass.

2. Method for Producing Ferrite Powder

The ferrite powder according to the present embodiments may be produced by any method. In particular, the ferrite powder can be produced by thermally spraying a mixture of ferrite raw materials under predetermined conditions and then quenching the mixture, as described below.

<Mixing of Raw Materials>

The ferrite raw materials are mixed to make a raw material mixture. Usable ferrite raw materials are known ferrite raw materials, such as oxides, carbonates, hydroxides, and/or chlorides. In addition, the raw materials may be mixed with a known mixer such as a Henschel mixer in either a dry state or wet state or in combination of both states.

<Calcination and Pulverization>

The resultant raw material mixture is then calcined to yield a calcined product. The calcination may be carried out by any known process. For example, a furnace may be used, such as a rotary kiln, a continuous furnace, or a batch furnace. The calcination may also be performed under known conditions. For example, the conditions include holding at 700 to 1300° C. for 2 to 12 hours in an atmosphere such as the ambient air.

<Granulation>

The resultant calcined product is pulverized and then granulated to yield a granular product. Any process may be used for the pulverization. For example, a known pulverizer may be used, such as a vibration mill, a ball mill, or a bead mill, and the pulverization may be performed in either a dry state or a wet state, or in combination of both states. The granulation may also be carried out by any known process. For example, water and optional additives, for example a binder such as polyvinyl alcohol (PVA), a dispersant, and/or an antifoaming agent, are added to the pulverized calcined product to adjust the viscosity of the product, and the granulation is carried out with a granulator such as a spray dryer.

In an ordinary step of producing ferrite particles, the binder ingredient is removed prior to a firing process. Different from the ordinary step, the present embodiments preferably include no binder eliminating process. Thermal spraying in a state containing a binder ingredient can effectively form the stepped feature.

As described above, the resultant ferrite powder containing an element having a high saturated vapor pressure, such as zinc (Zn) and strontium (Sr), can readily form polyhedral particles. Nonetheless, even when the element having a high saturated vapor pressure is contained, appropriate control of a temperature in a high-temperature heating process (e.g., thermal spraying process) described later can result in the formation of particle surfaces having a fine stepped feature with a polyhedral shape while maintaining a perfectly spherical particle shape. Such a formation is based on a difference in saturated vapor pressure between iron (Fe), which is the main element of ferrite, and the other elements besides iron (Fe). Furthermore, in order to appropriately control the temperature, it is advantageous to utilize the endothermic reaction of the binder ingredient contained in the raw material particles (granular product) subjected to the high-temperature heating process (e.g., thermal spraying process).

Specifically, a mixture of ferrite powder and binder is preferably adjusted such that the relative amount of binder resin ($B \times (M_{Fe} + M_m)/M_m$, unit: mass %) represented by the raw material particle composition ($M_{Fe}$, $M_m$) and the amount of binder resin (B) satisfies the following Expression (1). In Expression (1), $M_{Fe}$ is the molar number of iron (Fe), $M_m$ is the total molar number of the other metal elements besides iron (Fe), and B is the amount of binder resin (unit: mass %).

[Expression 1]

$$0.06 \leq B \times \left( \frac{M_{Fe} + M_m}{M_m} \right) \leq 0.30 \quad (1)$$

A relative amount of the binder ingredient of less than 0.06 significantly decreases the content of the binder ingredient. In such a range, the temperature of the thermal spraying flame is outstandingly raised; hence, the stepped feature barely forms even in particles with a perfectly spherical shape. A relative amount of the binder ingredient exceeding 0.30 significantly increases the content of the binder resin. In such a range, the temperature of the thermal spraying flame is outstandingly lowered; hence, a large number of odd-shaped particles are formed along with perfectly spherical particles. The relative amount of the binder resin is more preferably 0.07 to 0.20.

<Thermal Spraying>

The resultant granular product is then thermally sprayed to yield a thermally sprayed product. In the thermal spraying process, a gas mixture of combustible gas and oxygen can be used to generate flames of combustible gas. The volume ratio of combustible gas to oxygen is preferably 1:3.5 to 1:6.0, more preferably 1:4.9 to 1:6.0, particularly more preferably 1:4.9 to 1:5.3. Such a volume ratio can appropriately promote the condensation of volatilized material and the formation of particles having a small particle size. A typical condition is a combustible gas flow of 7 $Nm^3$/hour to an oxygen gas flow of 35 $Nm^3$/hour, i.e., a volume ratio of the combustible gas to oxygen of 1:5.

Under conditions having an excessive amount of combustible gas or oxygen, the combustible gas or oxygen that was not used for combustion may deprive the heat generated through the combustion to lower the temperature of the flame. Accordingly, it is not preferred that the thermal spraying is performed under such conditions. The amount of excess combustible gas not used for combustion is preferably 20% by volume or less of the amount of supplied combustible gas. The amount of excess oxygen not used for combustion is preferably 20% by volume or less of the amount of supplied oxygen.

Examples of the combustible gas used in the thermal spraying process include flammable gases, such as propane gas, propylene gas, and acetylene gas, among which particularly preferred is propane gas. In order to transport the granular product into the flammable gas, a carrier gas may be used, such as nitrogen, oxygen or air. The flow rate of the granular product to be transported is preferably 20 to 60 msec. The thermal spraying temperature is preferably 1000 to 3500° C., more preferably 2000 to 3500° C. Such conditions can more appropriately promote the condensation of volatilized material and the formation of particles having a relatively small particle size. In addition, the shape of the resulting ferrite particles can be more appropriately adjusted.

A cooling gas is then introduced into the particles ferritized by the thermal spraying to quench and solidify the particles, and the solidified particles are recovered with a cyclone separator or a filter. The recovered ferrite particles may be classified as necessary. The usable cooling gas may be ambient air at room temperature. Alternatively, in order to quench and prevent oxidation, air at a temperature lower than room temperature or an inert gas (e.g., nitrogen gas, helium gas, and argon gas) can also be used. In the classification process, the particle size is adjusted to a desired size using an existing process, such as wind power classification (air flow classification), mesh filtration, sieving classification, and sedimentation. The particles having a large particle size can be separated and recovered in a single step by airflow classification, such as cyclone separation.

In order to yield ferrite particles having a stepped feature (sphere-like stepped particles), it is essential that the granular product is thermally sprayed under predetermined conditions. In the thermal spraying, the entire granular product is melted and then rapidly cooled. Although the detailed mechanism is unknown, a plausible hypothesis is that a polygonal stepped feature reflecting the crystal structure of ferrite is formed on the particle surface during melting at a high temperature and cooled while maintaining such a feature by quenching. In other words, the granular product containing the binder is thermally sprayed, and the primary particles in the raw material are then transformed into ferrite particles (sphere-like stepped particles) while the binder is decomposed. Since such decomposition of the binder exhibits an endothermic reaction, the heat is not given more than necessary after the formation of the stepped feature. Consequently, it is speculated that an obvious stepped feature can readily be formed and maintained. In contrast, the granular product containing no binder or very small content of binder receives excess heat from the flame. Accordingly, even if the stepped feature is formed, such a stepped feature is not maintained on the entire particle surface over time and locally disappears. The granular product preferably has a binder content of 0.007% by mass or more to the mass of the granular product. The granular product containing excess content of binder tends to generate the ferrite particles not having a perfectly spherical shape due to vigorous endothermic reaction. The granular product has a binder content of preferably 0.100% by mass or less, more preferably 0.050% by mass or less to the mass of the granular product.

If the granular product were fired at a temperature lower than the melting point to form ferrite particles, a polygonal stepped feature would be barely formed, or would disappear by slow cooling even if such a stepped feature is formed. For example, in Patent Document 6, a carrier core material having stepped irregularities on the particle surface is produced by granulating the raw material mixture and then firing at a temperature of 1000° C. or lower (claim 1 in Patent Document 6). However, such stepped irregularities are concentric, and its shape is different from a stepped feature targeted by the present embodiments.

The conditions in the thermal spraying process are also critical. That is, the mechanism where the stepped feature is created changes depending on the cooling time from the temperature at which the raw material particles pass through the thermal spraying flame (corresponding to the amount of heat transferred to the raw material particles) to room temperature. In particular, the stepped feature is created by quenching the primary particles as raw material that have passed through the flame at a high temperature. Even in a flame at the same temperature, as the number of primary particles as raw material per unit time (amount processed per unit time) increases, the number of the resulting stepped features decreases. From the viewpoint of creating the stepped feature, it is preferred that a smaller amount of raw material is supplied to the thermal spraying process. For example, the supplied amount is preferably 20 kg/hour or less, more preferably 10 kg/hour or less, most preferably less than 5 kg/hour.

A ratio of the combustible gas is preferably 1.05 to 2.00. The term "ratio of the combustible gas" indicates the ratio of the amount of the net combustible gas ($Nm^3$/hour) used for combustion to the amount of supplied raw material (kg/hour), which is calculated in accordance with the following Expression (2):

[Expression 2]

$$(\text{Ratio of combustible gas}) \qquad (2)$$

$$= \frac{\text{Amount of net combustible gas used for combustion} \left(Nm^3/\text{hour}\right)}{\text{Amount of supplied raw material} \left(kg/\text{hour}\right)}$$

The amount of the net combustible gas ($Nm^3$/hour) used for combustion is calculated in accordance with the following Expression (3) or the following Expression (4):

[Expression 3]

$$(\text{Amount of net combustible gas for combustion}) = (\text{Amount of supplied oxygen})/5 \qquad (3)$$

[where (amount of supplied combustible gas)×5−(amount of supplied oxygen)≥0]

[Expression 4]

$$(\text{Amount of net combustible gas for combustion}) = (\text{Amount of supplied combustible gas}) \qquad (4)$$

[where (amount of supplied combustible gas)×5−(amount of supplied oxygen)<0]

3. Ferrite Resin Composite Material

The ferrite resin composite material according to the present embodiments contains the ferrite powder described above and resin. The use of such composite material prevents the detachment of the ferrite particles without impairing the formability and the filling ability.

Examples of the resin constituting the composite material include epoxy resin, urethane resin, acrylic resin, silicone resin, polyamide resin, polyimide resin, polyamide-imide resin, fluororesin, or combinations thereof. The silicone resin may be a modified silicone resin modified with, for example, acrylic, urethane, epoxy and/or fluorine groups.

The composite material may include other ingredients than the ferrite powder and the resin. Examples of such ingredients include solvents, fillers (organic fillers, inorganic fillers), plasticizers, antioxidants, dispersants, colorants such as pigments, and/or thermally conductive particles.

The percentage content of ferrite powder to the total solid content in the composite material is preferably 50 to 95% by mass, more preferably 80 to 95% by mass. The percentage content of the resin to the total solid content in the composite material is preferably 5 to 50% by mass, more preferably 5 to 20% by mass. Such percentage contents of the ferrite powder and the resin leads to higher dispersion stability of the ferrite powder in the composite material, superior storage stability and formability of the composite material, and higher mechanical strength and electromagnetic wave shielding properties of the resultant composite articles (shaped articles) formed from the composite material.

4. Electromagnetic Shielding Material, Electronic Material, and Electronic Component The electromagnetic shielding material, electronic material or electronic component according to the present embodiments includes the ferrite resin composite material described above. The electromagnetic shielding material, electronic material, or electronic component may be produced through shaping the composite material by any known process. The technique of shaping includes, but not limited to, compression molding, extrusion molding, injection molding, blow molding, and calender molding. A technique of forming a coating film of a composite material on a substrate may also be used.

As described above, the ferrite powder according to the present embodiments is characterized by containing of ferrite particles with a specific shape having a specific stepped feature on the surfaces thereof. Such ferrite powder is suitable for applications of electromagnetic shielding materials, electronic materials and/or electronic components. In addition, the ferrite powder, the ferrite resin composite material, the electromagnetic shielding material, the electronic material, or the electronic component according to the present embodiments can prevent the detachment of the ferrite particles without impairing the formability and the filling ability. In contrast, Patent Documents 1 to 5 include no descriptions regarding the surface feature of ferrite particles, and do not target the prevention of the detachment of particles. Furthermore, the carrier core material disclosed in Patent Document 6 has concentric stepped irregularities on the surface thereof, which shape is different from the stepped feature targeted by the present embodiments. Also, the object is to improve the electrification properties on the carrier core material ([0026] in Patent Document 6), which is irrelevant to the detachment of particles.

EXAMPLES

The present embodiments will now be described more specifically by the following Examples.
(1) Preparation of Ferrite Powder Example 1

<Mixing of Raw Materials>

Iron oxide ($Fe_2O_3$) and trimanganese tetraoxide ($Mn_3O_4$) as raw materials were weighed into a molar ratio of iron (Fe) to manganese (Mn) of 7.8:1, and then were mixed with a Henschel mixer.
<Calcination and Pulverization>

The resultant mixture was calcined in a rotary kiln. The calcination was carried out by keeping the mixture in the ambient air at 900° C. for four hours. The calcined product was coarsely pulverized with a dry bead mill (including 3/16 inch steel ball beads), and then finely pulverized in the presence of water with a wet bead mill (including 0.65 mm zirconia beads). The pulverized powder had a particle diameter of 2.26 μm.
<Granulation>

Polyvinyl alcohol (PVA, 10% aqueous solution) as a binder was added to the resultant slurry in an amount of 0.017% by mass in terms of solid content. The slurry containing the binder was then granulated with a spray dryer.

<Thermal Spraying>

The resultant granular material was thermally sprayed in flames of combustible gas and then quenched. The thermal spraying was performed under the conditions including a flow rate of propane gas of 7.0 m³/hour, a flow rate of oxygen of 35 m³/hour, and a supply rate of raw material of 4.5 kg/hour. Cooling air was introduced into the combustible gas immediately after the thermal spraying to quench the thermally sprayed product, and the quenched product was recovered with a cyclone separator located downstream of the gas flow. Coarser powder was removed from the thermally sprayed product with a sieving separator, and finer powder was further removed with a classifier to yield a ferrite powder composed of multiple manganese (Mn)-based ferrite particles.

Example 2

Cooling air was introduced into the combustible gas immediately after the thermal spraying to quench the thermally sprayed product, which was then recovered with a bag filter located downstream of the gas flow. Although coarser powder was removed from the thermally sprayed product by airflow classification, finer powder was not removed. A ferrite powder was prepared as in Example 1 regarding the other parts of the procedure.

Example 3

Prior to the mixing, raw materials were weighed into a molar ratio of iron (Fe) to manganese (Mn) of 3.0:1. In the granulation, polyvinyl alcohol (PVA, 10% aqueous solution) as a binder was added to the resultant slurry in an amount of 0.044% by mass in terms of solid content. A ferrite powder was prepared as in Example 1 regarding the other parts of the procedure. In Example 3, the pulverized powder after the calcination and pulverization had a particle size of 2.52 μm.

Example 4

Cooling air was introduced into the combustible gas immediately after the thermal spraying to quench the thermally sprayed product, and the quenched product was recovered by a bag filter located downstream of the gas flow. Although coarser powder was removed from the resultant thermally sprayed product by airflow classification, finer powder was not removed. A ferrite powder was prepared as in Example 3 regarding the other parts of the procedure.

Example 5

Prior to the mixing, raw materials were weighed into a molar ratio of iron (Fe) to manganese (Mn) of 14.0:1. In the granulation, polyvinyl alcohol (PVA, 10% aqueous solution) as a binder was added to the resultant slurry in an amount of 0.010% by mass in terms of solid content. A ferrite powder was prepared as in Example 1 regarding the other parts of the procedure. In Example 5, the pulverized powder after the calcination and pulverization had a particle size of 2.01 μm.

Example 6

The thermal spraying was performed under the conditions including a flow rate of propane gas of 7.5 m³/hour, a flow rate of oxygen of 35 m³/hour, and a supply rate of raw material of 4.5 kg/hour. Cooling air was introduced into the combustible gas immediately after the thermal spraying to quench the thermally sprayed product, which was then recovered by a bag filter located downstream of the gas flow. Although coarser powder was removed from the resultant thermally sprayed product by airflow classification, finer powder was not removed. A ferrite powder was prepared as in Example 5 regarding the other parts of the procedure.

Example 7

The thermal spraying was performed under the conditions including a flow rate of propane gas of 7.5 m³/hour, a flow rate of oxygen of 37.5 m³/hour, and a supply rate of raw material of 6 kg/hour. Cooling air was introduced into the combustible gas immediately after the thermal spraying to quench the thermally sprayed product, which was then recovered with a cyclone separator located downstream of the gas flow. A ferrite powder was prepared as in Example 1 regarding the other parts of the procedure.

Example 8

Cooling air was introduced into the combustible gas immediately after the thermal spraying to quench the thermally sprayed product, which was then recovered by a bag filter located downstream of the gas flow. Although coarser powder was removed from the resultant thermally sprayed product by airflow classification, finer powder was not removed. A ferrite powder was prepared as in Example 7 regarding the other parts of the procedure.

Example 9 (Comparative)

In place of the thermal spraying, the granular product was fired after eliminating the binder. The resultant fired product was crushed, and coarser powder and finer powder were then removed from the crushed product by airflow classification. Debindering and firing were carried out by keeping the granular product at 650° C. for four hours in the ambient air and then at 1250° C. for four hours in an atmosphere having 0% by volume of oxygen. The crushing was carried out with a hammer crusher. A ferrite powder was prepared as in Example 1 regarding the other parts of the procedure.

Table 1 shows the conditions for production of the ferrite powders in Examples 1 to 9.

(2) Preparation of Composite Material

Ferrite resin composite materials were prepared with the ferrite powders produced in Examples 1 to 9. The composite material was prepared as follows: The ferrite powder and a commercially available epoxy resin were weighed into a ferrite powder content of 60% by volume, and the mixture was homogenized into a paste in a rotating/revolving mixer. The viscosity of the paste was measured with a viscometer. The paste was poured into a silicone resin mold and then heat-cured to prepare a sample (composite material) for evaluation of the detachment of particles.

(3) Evaluation

Various properties of the ferrite powders and composite materials prepared in Examples 1 to 9 were evaluated by the following items.

<Elemental Analysis—Contents of Metal Elements>

The contents of metal elements in the ferrite powder were measured as follows: To 0.2 g of a sample (ferrite powder) was added 60 ml of pure water, 20 ml of 1N hydrochloric acid, and 20 ml of 1N nitric acid, and the mixture was heated until the sample was completely dissolved to prepare an aqueous solution. The aqueous solution was placed in an ICP analyzer (Shimadzu Corporation, ICPS-10001V), and the contents of metal elements were measured.

<Surface Profile of Particle—Ps>

The surface profile of particles in the ferrite powder was evaluated as follows: The ferrite powder was observed with a scanning electron microscope (SEM; Hitachi High-Tech Corporation, SU-8020). In the observation, the magnification was set into 50,000 folds for particles having a mean particle size of 2 μm or more, and 200,000 folds for particles having a mean particle size of less than 2 μm. In each case, the images were photographed in a field of view that includes 1 to 30 particles, preferably 1 to 10 particles having a horizontal Feret diameter of 0.3 μm or more.

The images were photographed in ten fields of view at random, and whether polygonal steps were present was confirmed for particles having a horizontal Feret diameter of 0.3 μm or more. The percentage content of the sphere-like stepped particles (Ps) was then calculated in accordance with Expression (5) below. Particles having a horizontal Feret diameter of less than 0.3 μm may preclude observation of the presence of the steps because the electron beam passes through the particles during photographing. Accordingly, these particles were excluded from the target of evaluation.

[Expression 5]

$$Ps(\%) = \frac{\sum_{i=1}^{10} n_i}{\sum_{i=1}^{10} N_i} \quad (5)$$

In this Expression, $N_i$ is the number of particles having a horizontal Feret diameter of 0.3 μm or more photographed in the i-th field of view, and $n_i$ is the number of sphere-like stepped particles among the particles photographed in the i-th field of view. Particles partially outside the field of view were each also counted as one perfect particle.

<Surface profile of Particle—Hs>

In the observation with a scanning electron microscope (SEM), the magnification was set into 200,000 folds, and 1 to 30, preferably 1 to 10 sphere-like stepped particles were photographed such that these particles were located in the center of the field of view. The mean interval (Hs) of the steps was then determined using the scale of SEM photograph in accordance with the following Expression (6):

[Expression 6]

$$Hs(nm) = \frac{\text{Total Length of parallel steps in perpendicular direction}}{\text{Number of steps}} \quad (6)$$

FIG. 1 illustrates an example of an SEM image for sphere-like stepped particle. The arrow (→) in the photograph indicates the direction perpendicular to the steps formed in parallel. The numbers (1, 2, 3, . . . ) in the photograph represent each step. It should be noted that the photographing may be carried out such that the steps can be identified, and thus the whole particle does not need to be included in one field of view. Any one location in one particle may be selected in the calculation of Hs. If several steps aligned in different directions are observed in one particle, the Hs may be calculated from any stepped profile generally representing the particle. The number of steps may be four or more.

<Shape Factor—in the Case of a Mean Particle Size of 2 μm or More>

For particles having a mean particle size of 2 μm or more, the shape factors (SF-1 and SF-2) of the ferrite powder were determined with a particle image analyzer (Malvern Panalytical Ltd., Morphologi G3). The ferrite powder was analyzed with a particle image analyzer. The image analysis was performed for each of 30,000 particles in the powder to automatically determine the circularity, the perimeter, and the circle equivalent diameter (CE Diameter). In the measurement, an objective lens having a magnification of 10 folds were used. The particles were dispersed on a slide glass with a jig for dispersion attached to the analyzer. In this preparation, the particles were dispersed under the conditions including a sample volume of 3 mm³ and a dispersion pressure of 5 bar.

The mean circularity, the mean perimeter and the mean circle equivalent diameter (CE Diameter) were determined by averaging the data given from the particles within ±5% of the volume average particle size among all the observed data, and SF-1 and SF-2 were calculated in accordance with the following Expression (7) and Expression (8):

[Expression 7]

$$SF - 1 = (\text{Mean circularity})^{-1} \times 100 \quad (7)$$

[Expression 8]

$$SF - 2 = \frac{\text{Mean perimeter (Perimeter)}}{\pi \times \text{Mean circle equivalent diameter (CE Diameter)}} \times 100 \quad (8)$$

<Shape Factor—in the Case of a Mean Particle Size of Less than 2 μm>

For particles having a mean particle size of less than 2 μm, the shape factors (SF-1 and SF-2) of the ferrite powder were determined with a field emission scanning electron microscope (FE-SEM). The ferrite powder was photographed in several fields of view with an FE-SEM. The photographing was performed under the condition including a magnification of 100,000 folds. The image analysis was then performed with image analysis software (Image-Pro Plus). In the analysis, 100 particles having a circle equivalent diameter within ±5% of a volume average particle size were selected, and analyzed respectively. The maximum length (horizontal Feret diameter) R (unit: μm), the projected peripheral length L (unit: μm), the projected area S (unit: μm²), and the circle equivalent diameter r (unit: μm) were measured.

SF-1 and SF-2 for each particle were calculated in accordance with Expression (9) and Expression (10) below, and mean values for all particles were determined to be SF-1 and SF-2 of the ferrite powder.

[Expression 9]

$$SF - 1 = \frac{R^2}{4\pi S} \times 100 \quad (9)$$

[Expression 10]

$$SF - 2 = \frac{L}{\pi r} \times 100 \quad (10)$$

<Percentage Content of Odd-Shaped Particles>

The percentage content of odd-shaped particles in the ferrite powder was determined as follows: In the analysis with a particle image analyzer, the number "N" of particles having a circularity of 0.965 to 1.000 and the number of particles "n" having a circularity of 0.950 to less than 0.965 are counted, and the percentage content of odd-shaped particles was calculated in accordance with Expression (11) below. Particles having a circularity of less than 0.950 are likely to be agglomerated. For this reason, such particles were excluded from the evaluation.

[Expression 11]

$$\text{Percentage content of odd shaped particles (\%)} = \frac{n}{n+N} \times 100 \quad (11)$$

<Tap Density>

The tap density of the ferrite powder was measured with a USP tap density analyzer (Hosokawa Micron Corporation, Powder Tester PT-X) in accordance with JIS Z 2512-2012.

<True Density>

The true density of the ferrite powder was measured using a gas replacement method in accordance with JIS Z8807: 2012. Specifically, the measurement was performed with a fully automatic truth density analyzer (Mountech Co., Ltd., Macpycno).

<Particle Size Distribution>

The particle size distribution of the ferrite powder was measured as follows: Into a 100 ml beaker was placed 10 g of a ferrite powder sample and 80 ml of water, and two droplets of sodium hexametaphosphate was added as a dispersant. The sample was then dispersed with an ultrasonic homogenizer (SMT Co., Ltd., UH-150). In this process, the output level of the ultrasonic homogenizer was set to 4, and the sample was dispersed for 20 seconds. The bubbles formed on the surface of the beaker were then removed, and the resultant dispersion was introduced into a laser diffraction particle size analyzer (Shimadzu Corporation, SALD-7500nano) for measurement. The conditions for measurement include a pump rate of 7, a built-in ultrasonic irradiation time of 30, and a refractive index of 1.70-050i. The 10% diameter (D10), the 50% diameter (volume average particle size, D50) and the 90% diameter (D90) in the volume distribution of particle sizes were determined through this measurement.

<BET Specific Surface Area>

The BET specific surface area of the ferrite powder was measured with a specific surface area analyzer (Mountech Co., Ltd., Macsorb HM model-1208). About 10 g of ferrite powder was placed on medicine wrapping paper and degassed with a vacuum dryer. After the vacuum pressure reaches −0.1 MPa or less, the powder was heated at 200° C. for two hours to remove water absorbed on the particle surface. The ferrite powder (about 0.5 to 4 g) free from water was then placed in a standard sample cell dedicated to the analyzer and correctly weighed with a precision balance. The weighed ferrite particles were then placed in the measuring port of the analyzer. The measurement was carried out by a one-point method. The atmosphere for measurement includes a temperature of 10 to 30° C. and a relative humidity of 20 to 80% (without dewing).

<Magnetic Properties—Saturation Magnetization, Remanent Magnetization, and Coercivity>

The magnetic properties (saturation magnetization, remanent magnetization, and coercivity) of the ferrite powder were measured as follows: A sample (ferrite powder) was packed in a cell having an inner diameter of 5 mm and a height of 2 mm, and placed in a vibrating sample magnetometer (Toei Industry Co., Ltd., VSM-C7-10A). A magnetic field was applied and swept up to 5 kOe, and the applied magnetic field was then reduced to draw a hysteresis curve. From the data in this curve, the saturation magnetization $\sigma$s, the remanent magnetization $\sigma$r, and the coercivity Hc of the sample were determined.

<Permeability>

The magnetic permeability of the ferrite powder was measured with an RF impedance/material analyzer (Agilent Technologies, Inc., E4991A) and a magnetic material measuring electrode (16454A). Into a polyethylene container (content capacity: 100 ml) was placed 9 g of a sample (ferrite powder) and 1 g of a binder resin (Kynar301F: polyvinylidene difluoride), and the mixture was stirred with a ball mill under conditions including a rotation rate of 100 rpm. The resultant mixture (about 0.6 g) was transferred into a die (inner diameter: 4.5 mm, outer diameter: 13 mm) and pressed at a pressure of 40 MPa for one minute with a pressing machine to yield a shaped article. The resultant shaped article was heat-cured at 140° C. for two hours with a hot air dryer to prepare a sample for measurement. The resultant sample was placed in the RF impedance/material analyzer, and the outer diameter, inner diameter and height of the sample preliminarily measured were input. In the measurement, the amplitude was set into 100 mV, and the frequency range of 1 MHz to 3 GHz was swept on a logarithmic scale. The real part ($\mu'$) and the imaginary part ($\mu''$) of the complex magnetic permeability at a frequency of 100 MHz were determined, and the loss coefficient (tan $\delta$) was calculated in accordance with the following Expression (12):

[Expression 12]

$$\tan\delta = \frac{\mu''}{\mu'} \quad (12)$$

<Percentage Content of Detached Particles>

The percentage content of detached particles in the composite material (composite article) was determined as follows: The composite material was polished with a grinder to expose the cross sections of particles. The polished cross sections were observed in multiple fields of view with a field emission scanning electron microscope (FE-SEM), and the number of ferrite particles and detached particles exposed on the outermost surface was counted. Since the portions from which the particles were detached are observed in the form of recesses on the polished cross section, the number of recesses was defined as the number of detached particles. The percentage content of the detached particles was then calculated in accordance with the following expression (13):

[Expression 13]

$$\text{Percentage content of detached particles (\% by number)} \quad (13)$$

$$= \frac{(\text{Number of detached particles})}{\begin{array}{c}(\text{Number of detached particles}) + \\ (\text{Number of exposed ferrite particles})\end{array}}$$

$$\times 100$$

(4) Results

Figure 4:
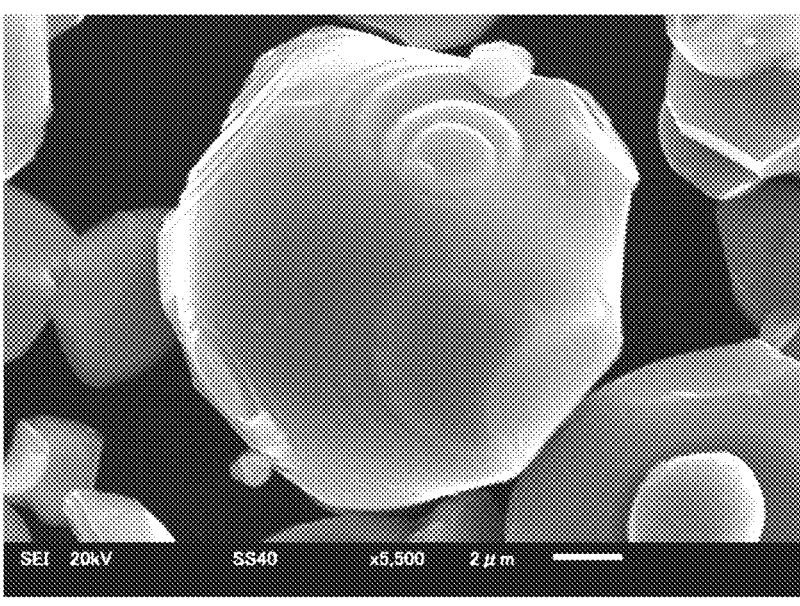
FIG. 4 illustrates a surface SEM image of a comparative sample.

Tables 2 and 3 show the results for evaluation in Examples 1 to 9. Surface SEM images of ferrite particles in Examples 1, 4, and 9 are illustrated in FIGS. 1, 2, and 4, respectively.

Table 2 shows that the particles contained in the ferrite powders of Examples 1 to 8 produced by the thermal spraying exhibit a spherical or polyhedral shape. In Examples 1, 3, 5 and 7 where the coarser powder was removed by sieving classification and the finer powder was removed by air flow classification, the volume average particle size D50 was relatively large (3.48 to 3.94 μm), and the particles had a spherical shape. In contrast, in Examples 2, 4, 6 and 8 where the coarser powder was removed by airflow classification and the finer powder was not removed, the D50 was relatively small (0.23 to 0.83 μm), and the particles had a polyhedral shape. However, all Examples 1 to 8 evidentially had a small shape factor SF-1 (101 to 102) and superior sphericity.

Examples 1 to 8 had a polygonal stepped feature on the particle surface; hence, the percentage content in number of detached particles was as small as 6% or less in the composite material. In particular, in Examples 1, 3 and 5 where the percentage content of sphere-like stepped particles (Ps) was as high as 64 to 67%, almost no detached particles were observed.

In contrast, the particles contained in the ferrite powder produced by firing in Example 9 were granular, and had no spherical or polyhedral shape. In addition, the particles in Example 9 had no stepped feature on the surface. Accordingly, the percentage content in number of detached particles in the composite material was as high as 15%.

TABLE 1

| | | | | | | | | | Thermal spraying | | | | | Classifi-cation | |
| Conditions for Production of ferrite powers | | | | | | | | | | | | | | | |
| | mixing of raw materials | | Cal-cinat-ion | particle diameter after pulver-ization (μm) | Binder (mass %) | Bx $(M_{Fe} + M_m)/M_m$ | De-bind-ering | Firing | Flow rate of pro-pane gas (m³/hr) | Flow rate of oxygen (m³/hr) | Supply rate of raw material (kg/hr) | Re-cover-ing pro-cess | Crush-ing | Coarse pow-der | Fine pow-der |
| | Fe (mol) | Mn (mol) | | | | | | | | | | | | | |
| Example 1 | 7.8 | 1 | 900° C. in air | 2.26 | PVA 0.017 | 0.15 | — | — | 7 | 35 | 4.5 | Cycl-one | — | Siev-ing | Air flow |
| Example 2 | 7.8 | 1 | 900° C. in air | 2.26 | PVA 0.017 | 0.15 | — | — | 7 | 35 | 4.5 | Bag filter | — | Air flow | — |
| Example 3 | 3 | 1 | 900° C. in air | 2.52 | PVA 0.044 | 0.18 | — | — | 7 | 35 | 4.5 | Cycl-one | — | Siev-ing | Air flow |
| Example 4 | 3 | 1 | 900° C. in air | 2.52 | PVA 0.044 | 0.18 | — | — | 7 | 35 | 4.5 | Bag filter | — | Air flow | — |
| Example 5 | 14 | 1 | 900° C. in air | 2.01 | PVA 0.010 | 0.15 | — | — | 7 | 35 | 4.5 | Cycl-one | — | Siev-ing | Air flow |
| Example 6 | 14 | 1 | 900° C. in air | 2.1 | PVA 0.010 | 0.15 | — | — | 7.5 | 35 | 4.5 | Bag filter | — | Air flow | — |
| Example 7 | 7.8 | 1 | 900° C. in air | 2.26 | PVA 0.017 | 0.15 | — | — | 7.5 | 37.5 | 6 | Cycl-one | — | Siev-ing | Air flow |
| Example 8 | 7.8 | 1 | 900° C. in air | 2.26 | PVA 0.017 | 0.15 | — | — | 7.5 | 37.5 | 6 | Bag filter | — | Air flow | — |
| Example 9* | 7.8 | 1 | 900° C. in air | 2.26 | PVA 0.017 | 0.15 | 650° C. in air | $O_2$ 0vol % 1250° C. | — | — | — | — | Ham-mer crusher | Air flow | Air flow |

Note

1) "*" indicates comparative example.

Note

2) "—" indicates unprocessed.

TABLE 2

Results for evaluation of ferrite powders

Ferrite powders

| | Chemical analysis (ICP) | | Particle shape | Surface feature of particles | | | Shape factors | | Percentage content of odd-shaped particles | Tap density | True density | Volume distribution of particle sizes (µm) | | | Percentage content of particles with 0.3 µm or more (& by number) | BET |
|---|---|---|---|---|---|---|---|---|---|---|---|---|---|---|---|---|
| | Fe (wt %) | Mn (wt %) | | Step | Ps (%) | Hs (nm) | SF-1 | SF-2 | (%) | (g/cm$^3$) | (g/cm$^2$) | D10 | D50 | D90 | | (m$^2$/G) |
| Example 1 | 63.0 | 7.6 | spherical | Polygonal | 65 | 15 | 101 | 101 | 7.5 | 2.75 | 5.01 | 1.92 | 3.72 | 8.95 | 99.8 | 0.55 |
| Example 2 | 63.1 | 8.5 | Polyhedral | Polygonal | 24 | 5 | 101 | 103 | 16.4 | 1.08 | 5.21 | 0.40 | 0.83 | 1.75 | 18.5 | 3.76 |
| Example 3 | 57.1 | 13.7 | spherical | Polygonal | 67 | 15 | 102 | 101 | 8.3 | 2.95 | 5.01 | 1.89 | 3.94 | 9.27 | 99.9 | 0.68 |
| Example 4 | 54.2 | 15.9 | Polyhedral | Polygonal | 27 | 5 | 102 | 102 | 15.9 | 1.21 | 5.20 | 0.10 | 0.51 | 1.45 | 22.8 | 5.91 |
| Example 5 | 66.2 | 5.3 | spherical | Polygonal | 64 | 15 | 101 | 101 | 7.8 | 3.00 | 5.01 | 1.66 | 3.78 | 9.18 | 99.8 | 0.58 |
| Example 6 | 62.7 | 5.1 | Polyhedral | Polygonal | 25 | 5 | 101 | 103 | 18.3 | 1.18 | 5.20 | 0.12 | 0.58 | 1.59 | 20.3 | 6.07 |
| Example 7 | 59.7 | 8.0 | spherical | Polygonal | 29 | 20 | 101 | 101 | 6.5 | 2.51 | 5.02 | 1.93 | 3.48 | 8.87 | 99.6 | 1.26 |
| Example 8 | 59.3 | 8.1 | Polyhedral | Polygonal | 15 | 5 | 101 | 103 | 18.1 | 1.04 | 5.22 | 0.09 | 0.23 | 1.32 | 6.5 | 9.93 |
| Example 9* | 61.7 | 7.7 | Granular | Closed curve | 0 | 550 | 106 | 106 | 20.2 | 2.66 | 5.19 | 7.92 | 11.00 | 16.02 | 100.0 | 0.43 |

Note
1) "*" indicates comparative example.

TABLE 3

Results for evaluation of ferrite powders and composite materials

| | Ferrite powders | | | | | | Composite articles | |
|---|---|---|---|---|---|---|---|---|
| | Magnetic properties (VSM) | | | Permeability (100 MHz) | | | Percentage content of detached particles | Viscosity |
| | σs | σr | Hc | µ' | µ'' | tan δ | particles | |
| | (A · m$^2$/kg) | (A · m$^2$/kg) | ((1000/4π)A/m) | | | | (% by number) | (mPa · s) |
| Example 1 | 84.7 | 2.9 | 41.7 | 6.88 | 0.35 | 0.05 | <1 | 80000 |
| Example 2 | 81.2 | 4.4 | 53.0 | 8.62 | 0.31 | 0.04 | <1 | 155000 |
| Example 3 | 77.1 | 3.6 | 58.2 | 8.03 | 1.05 | 0.13 | <1 | 85000 |
| Example 4 | 75.8 | 5.6 | 61.3 | 9.72 | 0.77 | 0.08 | <1 | 180000 |
| Example 5 | 83.8 | 2.6 | 34.8 | 5.19 | 0.15 | 0.03 | <1 | 83000 |
| Example 6 | 77.1 | 6.8 | 72.0 | 8.21 | 0.16 | 0.02 | <1 | 185000 |
| Example 7 | 82.4 | 3.1 | 42.0 | 7.47 | 0.82 | 0.11 | 6 | 120000 |

TABLE 3-continued

| Results for evaluation of ferrite powders and composite materials | | | | | | | | |
| --- | --- | --- | --- | --- | --- | --- | --- | --- |
| | Ferrite powders | | | | | | Composite articles | |
| | Magnetic properties (VSM) | | | Permeability | | | Percentage content of detached | |
| | σs | σr | Hc | (100 MHz) | | | particles | Viscosity |
| | (A · m²/kg) | (A · m²/kg) | ((1000/4π)A/m) | μ' | μ" | tan δ | (% by number) | (mPa · s) |
| Example 8 | 73.0 | 9.3 | 85.6 | 9.14 | 0.52 | 0.06 | 1 | 250000 |
| Example 9. | 92.9 | 3.9 | 51.0 | 4.56 | 1.88 | 0.41 | 15 | 35000 |

Note
1) "*" Indicates comparative example.

The invention claimed is:

1. A ferrite powder comprising spherical or polyhedral ferrite particles having a stepped feature on the surfaces thereof, wherein the stepped feature has polygonal contours on the surfaces of ferrite particles, and a mean interval between adjacent step edges is in a range of 3 nm or more or 50 nm or less.

2. The ferrite powder according to claim 1, wherein the stepped feature has two or more steps.

3. The ferrite powder according to claim 1, wherein the ferrite powder has a shape factor SF-1 of 100 to 110.

4. The ferrite powder according to any one of claim 1, wherein the ferrite powder has a 50% diameter (D50) of 0.10 to 20.00 μm in a volume distribution of particle sizes thereof.

5. The ferrite powder according to claim 1, wherein the ferrite powder has a composition of manganese (Mn) ferrite containing manganese (Mn) in a content of 4.0 to 17.0% by mass and iron (Fe) in a content of 50.0 to 70.0% by mass.

6. A ferrite resin composite material comprising the ferrite powder according to claim 1 and a resin.

7. An electromagnetic shielding material, an electronic material, or an electronic component comprising the ferrite resin composite material according to claim 6.

* * * * *